US 11,094,619 B2

(12) United States Patent
Schindler et al.

(10) Patent No.: US 11,094,619 B2
(45) Date of Patent: *Aug. 17, 2021

(54) PACKAGE WITH COMPONENT CONNECTED WITH CARRIER VIA SPACER PARTICLES

(71) Applicant: Infineon Technologies AG, Neubiberg (DE)

(72) Inventors: Manfred Schindler, Regensburg (DE); Franz-Peter Kalz, Regensburg (DE); Volker Strutz, Tegernheim (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/595,546

(22) Filed: Oct. 8, 2019

(65) Prior Publication Data

US 2020/0043836 A1    Feb. 6, 2020

Related U.S. Application Data

(62) Division of application No. 15/949,533, filed on Apr. 10, 2018, now Pat. No. 10,438,878.

(30) Foreign Application Priority Data

Apr. 10, 2017 (DE) ..................... 10 2017 107 715.4

(51) Int. Cl.
| | |
|---|---|
| *H01L 23/495* | (2006.01) |
| *H01L 23/31* | (2006.01) |
| *H01L 25/16* | (2006.01) |
| *H01L 43/04* | (2006.01) |
| *H01L 23/00* | (2006.01) |

(Continued)

(52) U.S. Cl.
CPC .... *H01L 23/49586* (2013.01); *H01L 21/4825* (2013.01); *H01L 23/3121* (2013.01); *H01L 23/4924* (2013.01); *H01L 23/49517* (2013.01); *H01L 23/49541* (2013.01); *H01L 23/49582* (2013.01); *H01L 23/49589* (2013.01); *H01L 23/562* (2013.01); *H01L 25/16* (2013.01); *H01L 43/04* (2013.01); *H01L 24/13* (2013.01); *H01L 24/16* (2013.01); *H01L 2224/13101* (2013.01);

(Continued)

(58) Field of Classification Search
CPC ............... H01L 23/49586; H01L 24/00; H01L 23/49541; H01L 21/4825; H01L 23/49582; H01L 23/49589; H01L 23/49517; H01L 23/562; H01L 23/3121; H01L 25/16; H01L 23/4924; H01L 43/04
See application file for complete search history.

(56) References Cited

U.S. PATENT DOCUMENTS 10,438,878 B2 * 10/2019 Schindler .......... H01L 23/49586
2003/0102543 A1    6/2003 Anzai et al.
(Continued)

*Primary Examiner* — Didarul A Mazumder
*Assistant Examiner* — Wasiul Haider
(74) *Attorney, Agent, or Firm* — Dicke, Billig & Czaja, PLLC

(57) ABSTRACT

A package and method of making a package. In one example, the package includes an at least partially electrically conductive carrier, a passive component mounted on the carrier, and an at least partially electrically conductive connection structure electrically connecting the carrier with the component and comprising spacer particles configured for spacing the carrier with regard to the component.

20 Claims, 5 Drawing Sheets

(51) Int. Cl.
  *H01L 23/492*  (2006.01)
  *H01L 21/48*  (2006.01)
(52) U.S. Cl.
  CPC ............... *H01L 2224/16245* (2013.01); *H01L 2924/181* (2013.01); *H01L 2924/19105* (2013.01)

(56) References Cited

U.S. PATENT DOCUMENTS

| | | | |
|---|---|---|---|
| 2011/0205689 A1* | 8/2011 | Vilcova | H01G 9/012 361/525 |
| 2016/0271737 A1* | 9/2016 | Ikeda | B23K 35/0227 |
| 2017/0225277 A1* | 8/2017 | Sharma | C22C 13/00 |
| 2018/0082930 A1* | 3/2018 | Khoo | H01F 1/36 |
| 2018/0294210 A1 | 10/2018 | Schindler et al. | |

* cited by examiner

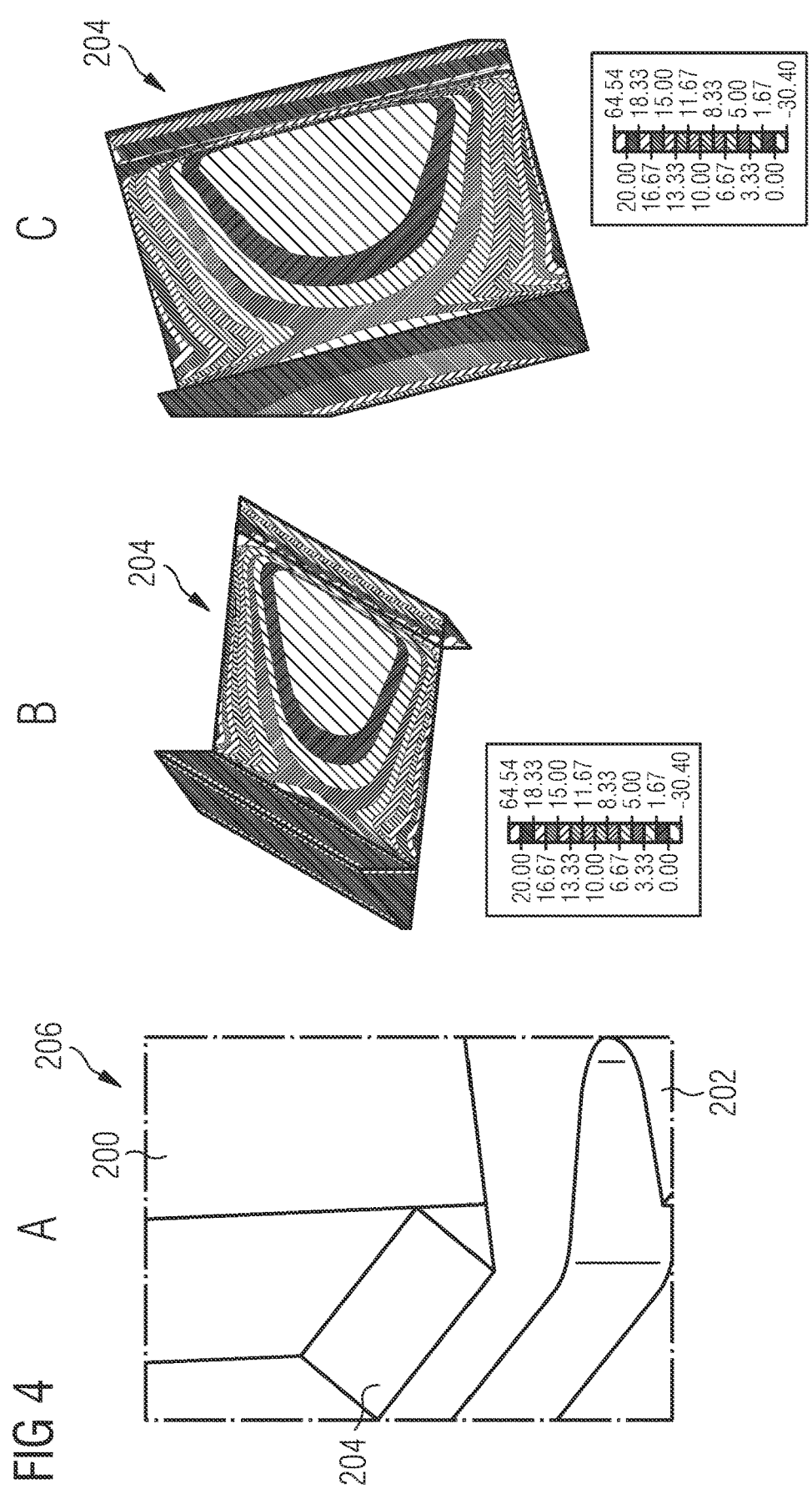

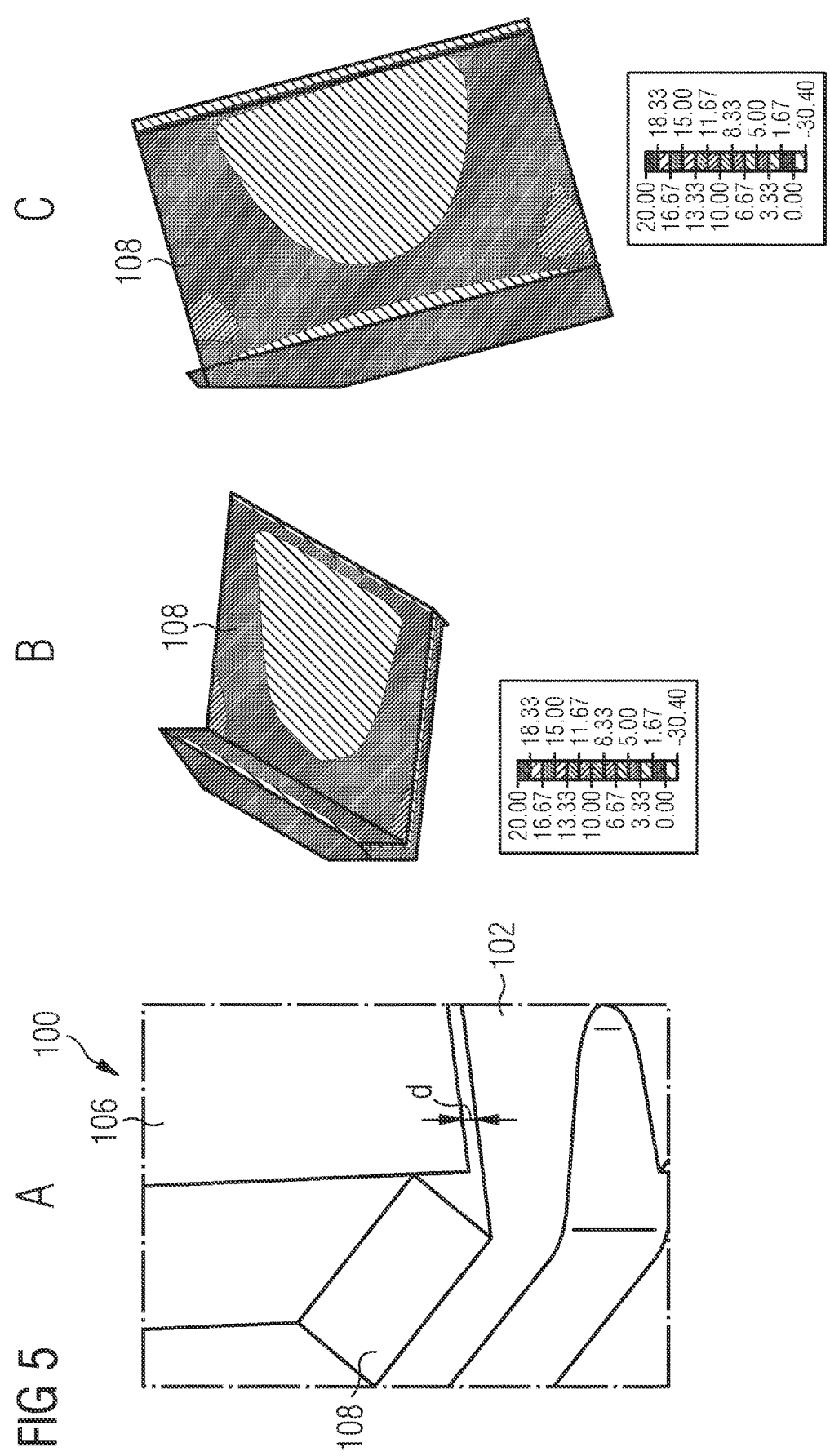

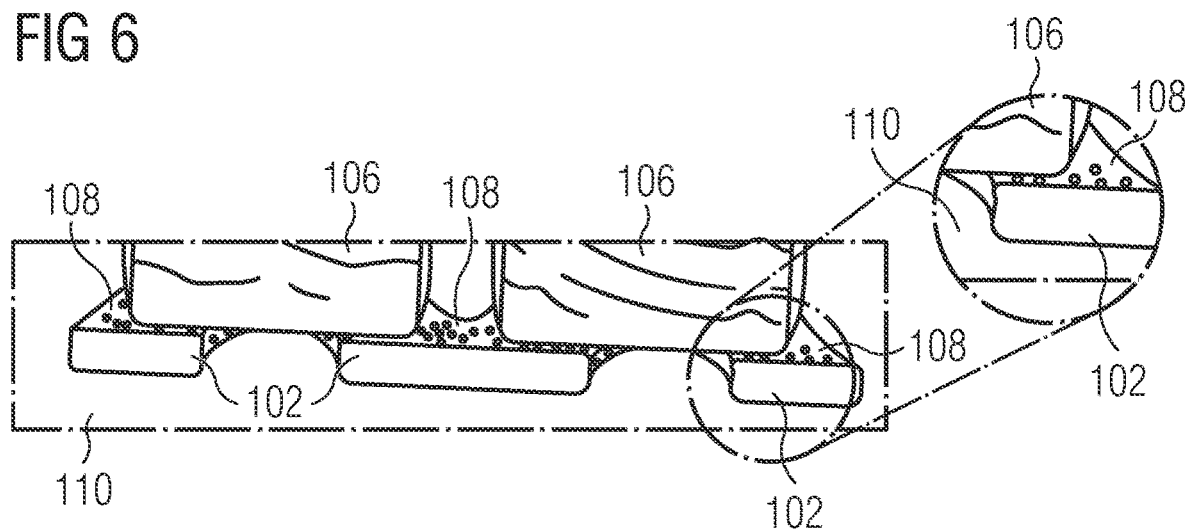

PACKAGE WITH COMPONENT CONNECTED WITH CARRIER VIA SPACER PARTICLES

CROSS-REFERENCE TO RELATED APPLICATION

This Utility Patent Applications is a divisional application of U.S. Ser. No. 15/949,533, filed Apr. 10, 2018 and claims priority to German Patent Application No. 10 2017 107 715.4, filed Apr. 10, 2017, all of which are incorporated herein by reference.

BACKGROUND OF THE INVENTION

The present invention relates to packages, and a method of manufacturing a package.

Conventional encapsulant materials, such as mold structures, for electronic components and in particular electronic chips have evolved to a level where the package no longer significantly impedes the performance of the components. Encapsulating electronic components during package manufacture may protect them against the environment.

However, there is still potentially room to reduce manufacturing cost and simplify processing while maintaining a high accuracy of the processing. Moreover, it becomes more and more challenging to manufacture packages which are reliably protected against delamination between its constituents.

BRIEF DESCRIPTION OF THE DRAWINGS

The accompanying drawings, which are included to provide a further understanding of exemplary embodiments and constitute a part of the specification, illustrate exemplary embodiments.

In the drawings:

FIG. 4 shows results of a simulation concerning mechanical load acting on a conventional package suffering from delamination.

FIG. 5 shows results of a simulation concerning mechanical load acting on a delamination robust package according to an exemplary embodiment.

FIG. 6 shows cross-sectional views of a delamination robust package according to an exemplary embodiment.

DETAILED DESCRIPTION OF EXEMPLARY EMBODIMENTS

Figure 1:
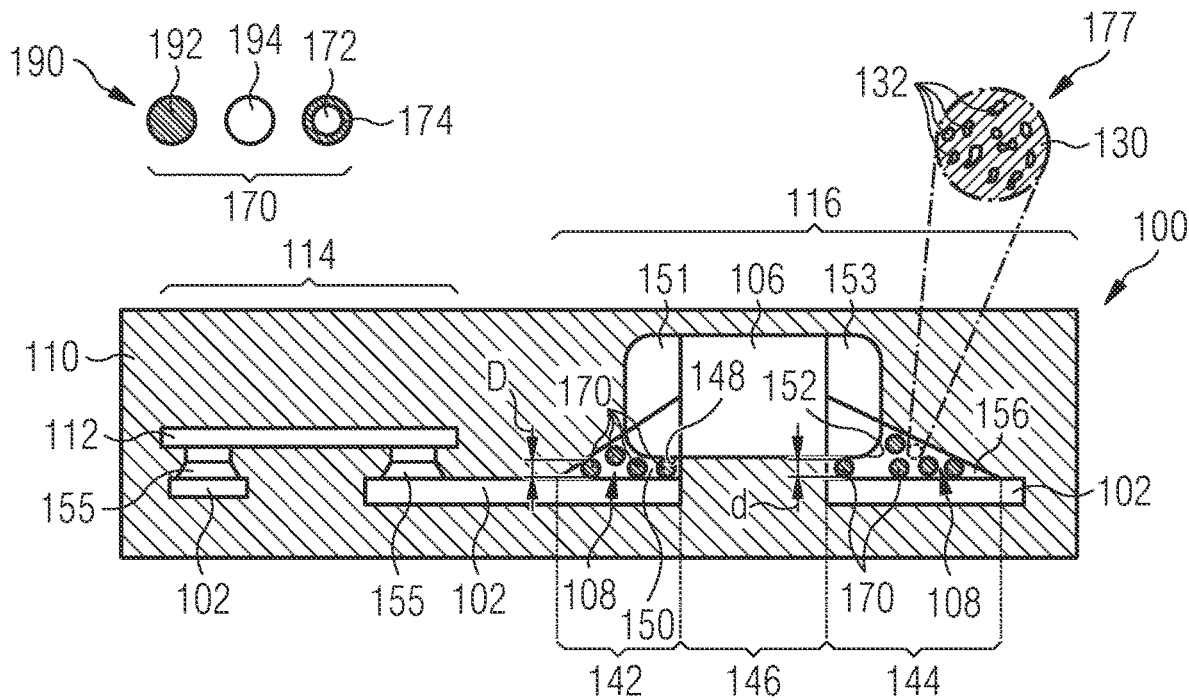
FIG. 1 shows a cross-sectional view of a package according to an exemplary embodiment connecting a passive component with a carrier by a connection structure embodied as partially electrically conductive glue.

There may be a need for a method of manufacturing a reliable package with efficient protection against delamination.

According to an exemplary embodiment, a package is provided which comprises an at least partially electrically conductive carrier, a passive component mounted on the carrier, and an at least partially electrically conductive connection structure electrically connecting the carrier with the component and comprising spacer particles configured for spacing the carrier with regard to the component.

According to another exemplary embodiment, a package is provided which comprises a plate-type carrier which comprises a first carrier section and a second carrier section separated by a recess, a component having a first surface portion electrically connected with the first carrier section by a first portion of a connection structure and having a second surface portion electrically connected with the second carrier section by a second portion of the connection structure, the connection structure configured for spacing the carrier with regard to the component by maintaining a minimum distance of at least 10 µm, and an encapsulant encapsulating at least part of the component.

According to yet another exemplary embodiment, a method of manufacturing a package is provided which comprises mounting an electronic component on a completely electrically conductive carrier, and forming an at least partially electrically conductive connection structure electrically connecting the carrier with the component and comprising spacer particles spacing the carrier with regard to the component.

According to an exemplary embodiment, a package is provided in which a minimum distance between a component and a carrier on which the component is mounted can be precisely defined. This can be accomplished by spacer particles which are included in a connection structure electrically and mechanically connecting carrier and component. Such spacer particles may be added in sufficient concentration and with sufficient dimensions so as to ensure that one or more spacer particles is or are located in the region of a smallest gap between component and carrier. As a result, the spacer particles can prevent the component from approaching the carrier by more than a critical distance below which the tendency of delamination increases significantly. It has turned out that the configuration of the connection structure with such spacer particles allows to precisely define a minimum distance between carrier and component to not fall to such a low value at which delamination between component and carrier may occur with a high risk. Therefore, the maintenance of a certain minimum distance, as guaranteed by the spacer particles, improves the electrical and mechanical reliability of the package. In particular, it has turned out that even at high temperatures and at very low temperatures as well as after an enormous number of temperature cycles, such a package remains free of delamination between component and carrier as a result of the maintenance of the minimum distance between them. Therefore, a package is provided which has pronounced reliability characteristics and is therefore also appropriate for demanding automotive applications or the like. In particular, such a manufacturing architecture enables production of packages with encapsulated surface mounted passive components with high performance. Highly advantageous, the spacer particles may be embedded directly in the electrically conducting connection structure rather than being provided as a separate spacer structure. This keeps the manufacturing process simple and the package compact and efficient.

In the following, further exemplary embodiments of the packages and the method will be explained.

In the context of the present application, the term "component" may particularly denote any electronic member which fulfils an electronic function in the package when mounted on the carrier. In particular, the component may be embodied as a passive component such as a capacitance, an inductance or an ohmic resistance. It is however also possible that the component is an active component.

In the context of the present application, the term "passive component" may particularly denote any electronic component that does not require a source of energy to perform its intended function. A passive component may be a component incapable of controlling current by another electrical signal. Resistors, capacitors, inductors, and transformers may in particular be all considered passive components.

In the context of the present application, the term "spacer particles" may particularly denote solid, preferably non-compressible particles with defined dimensions being capable of maintaining (in particular defining) a sufficient distance between carrier and component due to their presence in a gap in between carrier and component. For example, the spacer particles may have a defined shape and/or one or more defined dimensions. For instance, the spacer particles may be spheres, cubes, cylinders, cones, irregular bodies, etc.

In an embodiment, the spacer particles have a diameter (in particular a maximum diameter) of at least 10 µm, in particular of at least 30 µm. It has turned out in experimental investigations described below in further detail that in particular when the spacer particles are provided with a diameter of at least 30 µm, a pronounced improvement of the protection of the package against undesired delamination between carrier and component can be obtained. However, in certain applications, an improvement of the delamination properties may be already obtained when using spacer particles of dimensions of at least 10 µm. In contrast to this, the absence of spacer particles may result in a distance between carrier and component of for instance only 2 µm to 3 µm which may result in an undesired delamination even in the absence of thermal cycles or in the absence of a very high or very low temperature.

In an embodiment, the spacer particles have a diameter (in particular a maximum diameter) of not more than 200 µm. It has turned out that when the diameter of the spacer particles becomes too large, the highly reliably electric coupling between component and carrier can be again reduced, for instance due to the formation of void spaces in the electrically conductive connection structure. Therefore, in order to ensure a very high reliability, it is advantageous to limit the dimension of the spacer particles to not more than 200 µm.

In an embodiment, the spacer particles have a substantially spherical shape. It has turned out that the use of spacer particles which have the shape of a sphere provide very good results in terms of protection against delamination. Spherical spacer particles can also be manufactured with a high accuracy in terms of shape and diameter and can be manufactured in a simple way. Regardless of the orientation of a spherical spacer particle, it will always maintain a predefined minimum distance between carrier and component. However, as an alternative to spherical spacer particles, it is also possible to provide cuboid spacer particles or the like. As a further alternative to spherical spacer bodies, the spacer particles may also have an ellipsoidal cross section. In a preferred embodiment, at least 80% of the spacer particles differ concerning diameter by less than 20%, in particular by less than 10%.

In an embodiment, the connection structure comprises an at least partially electrically conductive glue, in which the spacer particles are embedded. In the mentioned embodiment, the electrically conductive glue may be mixed with the spacer particles. Upon curing such a material of the connection structure, the electrically conductive glue will provide an electric connection between component and carrier as well as an adhesion between component and carrier. At the same time, the spacer particles may maintain a definable spacing between component and carrier.

For instance, the at least partially electrically conductive glue may be embodied as an electrically insulating glue with electrically conductive particles therein. Preferably, the electrically conductive particles are smaller than the spacer particles so as to reliably ensure a direct electrically conductive path from carrier to component via electrically conductive particles. What concerns the composition of the at least partially electrically conductive glue, it is in particular preferred that the latter is composed of electrically insulating glue (for instance epoxy-based glue) in which electrically conductive particles (such as unspecifically shredded silver or the like) may be dispersed, the latter providing for the electric conductivity.

Alternatively, the glue itself may be electrically conductive.

The spacer particles may optionally also contribute to the electrical conductivity of the electrically conductive connection structure and therefore for the electric coupling between component and carrier.

In another embodiment, the connection structure comprises a solder (rather than a glue) in which the spacer particles are embedded. In such an embodiment, it is for instance possible to use solder paste as the solderable material and mix the solder paste with the spacer particles. The solder component may then serve for providing mechanical adhesion and electrical coupling, and the spacer particles may maintain a defined distance between component and carrier being then connected by a solder connection.

In an embodiment, the spacer particles comprise at least one of the group consisting of fully electrically conductive spacer particles, fully electrically insulating spacer particles, and spacer particles having an electrically insulating core and an electrically conductive coating at least partially covering the core. Thus, in one embodiment, the entire spacer particles may be electrically conductive, for instance may be metal beads. In another embodiment, the spacer particles may be entirely dielectric, for instance may be silicon oxide particles. In yet another embodiment however, spacer particles with a dielectric core (for instance made of silicon oxide) are provided which are covered with an electrically conductive coating (for instance a metallic plating layer). In the latter mentioned embodiment, the coating may contribute to the electric coupling between component and carrier, whereas the core material may be optimized in terms of another function (such as a heat removal capability).

In an embodiment, the carrier comprises a first carrier section and a second carrier section separated by a recess, wherein the component has a first surface portion electrically connected with the first carrier section by a first portion of the connection structure and has a separate second surface portion electrically connected with the second carrier section by a second portion of the connection structure. Therefore, the component may have two surface portions corresponding to two terminals of the component. For connecting both terminals of the component, respective sections of the connection structure may be provided which couple the respective terminal to a corresponding portion of the carrier. Therefore, two (or more) different coupling regions may be provided in the package, both (or all) of which comprising spacer particles for maintaining the respective distance. The distance in the two separate coupling regions may be the same, thereby ensuring a parallel alignment between component and carrier (for instance a carrier plate).

In an embodiment, the minimum distance maintained by the spacer particles may correspond to a bond line distance of more than 20 µm. In particular, the connection structure may comprise spacer particles having a diameter defining this minimum distance. The minimum distance between carrier and component may be denoted as bond line distance and may differ from the diameter of the spacer particles. For instance, when the diameter of the spacer particles is 30 µm, the bond line distance may nevertheless be 25 µm, since the region of the smallest thickness between carrier and component may be spaced from the region where the spacer particles are present. It has turned out in experiments that a bond line distance of more than 20 µm ensures a reliable protection against undesired delamination.

In an embodiment, the component is a surface mounted device (SMD) component. The component may hence be a component which is mounted on a surface of the carrier. However, according to an exemplary embodiment, such a surface-mounted component may nevertheless be encapsulated after mounting, as described below.

The component, which may be a passive component, may be selected from a group consisting of a capacitor, an ohmic resistance, and an inductance. Other passive components may be implemented as well. In a preferred embodiment, the component is a ceramic capacitor. Such a ceramic capacitor may be used as a smoothing capacitor for smoothing an electric signal provided for instance by an electronic chip, which may be mounted on the same carrier. Such a ceramic capacitor may have two terminals to be connected via separate, independent and electrically decoupled portions of the connection structure with different sections of the carrier.

In an embodiment, the carrier is a leadframe or another completely electrically conductive carrier. A leadframe may be a copper plate being patterned (for instance punched or etched) so as to form various sections thereof. Such a leadframe may be planar. More generally, the carrier may be embodied as a plate-type carrier being planar so that a planar main surface of the carrier can be arranged in parallel to a planar main surface of the component connected thereto via the connection structure. Spacer particles of a uniform shape and dimension contribute to such a parallel alignment between carrier and component which additionally increases reliability and reproducibility of the manufactured packages.

In an embodiment, the package comprises an encapsulant encapsulating the component, the connection structure and part of the carrier. Also an electronic chip may be encapsulated by the same or another encapsulant structure. By such an encapsulant, a mechanical protection of the component and the carrier may be achieved as well as an electric decoupling of the interior of the package with regard to an electronic environment. In an attempt to use environmentally friendly materials, the use of a green mold compound as encapsulant may be favoured compared to other mold compounds. However, it has been surprisingly found that issues in terms of delamination in the presence of thin connection structures between component and carrier are particularly pronounced with such green mold compound. Therefore, the presence of spacer particles for maintaining a predefined minimum distance (of for instance at least 10 µm or at least 30 µm) between carrier and component is particularly advantageous when using green mold compound.

More generally, the encapsulant may comprise at least one of the group consisting of a mold compound and a laminate. In a preferred embodiment, the encapsulant is a mold compound. For the encapsulating by molding, a plastic material or a ceramic material may be used. The encapsulant may comprise an epoxy material. Filler particles (for instance $SiO_2$, $Al_2O_3$, $Si_3N_4$, BN, AlN, diamond, etc.), for instance for improving thermal conductivity, may be embedded in an epoxy-based matrix of the encapsulant. Laminate packaging is however possible as well.

In an embodiment, the package comprises additionally an electronic chip mounted on the same carrier as the (for instance passive) component. Preferably, the (for instance passive) component and the electronic chip (which may be an active component) may be electrically coupled and/or may functionally cooperate. Such an electronic chip may for instance be a sensor chip or a power semiconductor chip which may be mounted on the same carrier as the component and which may be functionally and electrically coupled with the component. In one embodiment, the component and the electronic chip are encapsulated by a common continuous encapsulant structure. In another embodiment, the component and a corresponding portion of the carrier may be encapsulated by a first encapsulant body, whereas the electronic chip and a corresponding other portion of the carrier may be encapsulated by another encapsulation body.

In an embodiment, the component and the electronic chip are mounted laterally spaced at different sections of the carrier. In such an embodiment, the portions of the carrier on which the electronic chip is mounted and on which the component is mounted may be juxtaposed or may be spatially separated. It is however also possible that the portions at least partially overlap. For instance, the electronic chip may be mounted on a portion of the carrier which fully encloses or encompasses the region on which the component is mounted.

In an embodiment, the electronic chip is a sensor chip, in particular a magnetic sensor chip. In such an embodiment, the sensor chip may sense a sensing signal and may generate a corresponding electric signal. The latter may be received by the component, for instance may be smoothened by a capacitor type component. In the mentioned example of a magnetic sensor chip, the magnetic sensor chip may for instance be of the Hall sensor type capable of detecting a magnetic field in an environment of the package. For instance, such a magnetic sensor chip may be implemented in an automotive application, for instance for sensing a crankshaft or cam shaft of an engine. In particular for such automotive applications, an extremely high reliability of the package is required, so that the efficient suppression of delamination tendencies by the spacer particles is specifically advantageous for such an application.

In an embodiment, the minimum distance is defined by a diameter of the spacer particles. Thus, at least part of the rigid incompressible spacer particles may enter a gap between carrier and component where carrier and component may have opposing and (at least substantially) parallel main surfaces. Hence, the presence of one or more spacer particles in this gap may maintain a minimum gap size and hence a minimum carrier-component distance. In such an embodiment, the minimum distance between carrier and component may be identical to the (for instance constant or maximum) diameter of the spacer particles. It is however also possible that the minimum carrier-component distance differs from (for instance is somewhat smaller than) the maximum diameter of the spacer particles (for instance when the component is slightly tilted with regard to the carrier with one or more spacer particles present within part of the gap).

In an embodiment, the method further comprises manufacturing a system in package using the above-described package as a constituent or part of the system in package. Correspondingly, the package may be configured as a system in package (SiP) or part thereof. Such a system in package may use a package of the above-described type with an encapsulated component on a carrier for forming a larger system with additional electronic functionality. Such a system in package may hence be packaged in a larger packaging casing or encapsulation. A system in package may be thus composed of a number of integrated circuits enclosed in a single module or package. The SiP may perform multiple electronic functions, and may for instance be used inside a mobile phone, etc. Dies containing integrated circuits may be stacked vertically on a carrier and may be internally electrically connected. An example SiP can contain several chips (such as a specialized processor, a memory, etc.) combined with passive components such as one or more resistors and/or capacitors which may all be mounted on the same carrier.

It has turned out that a package according to an embodiment in which a defined thickness of for instance at least 20 μm between component and carrier is maintained as a result of the provision of spacer particles, allows to obtain such a pronounced suppression of delamination tendency that it survives 2000 hours at 175° C. as well as 1000 temperature cycles between −50° and +150°. Therefore, a package according to an exemplary embodiment may also fulfil demanding requirements of automotive applications. This particularly holds for an encapsulated package which uses a halogen-free green mold compound.

In the connection structure, for instance 70 mass-% to 90 mass-% silver particles may be embedded in about 10 mass-% to 30 mass-% non-conductive glue. This at least partially adhesive glue may be mixed with spacer particles. For instance, between 1 mass-% and 30 mass-%, more particularly between 3 mass % to 10 mass-%, spacer particles in relation to the at least partially conductive glue may be provided. Such a silver-based glue may be dispensed on the for instance leadframe-type carrier, and then the component (in particular a ceramic capacitor) may be attached thereto. The glue may be cured at a temperature of 180° C., to thereby obtain the package. A so obtained package, which may be subsequently encapsulated by an encapsulant such as a green mold compound, has a minimum standoff between component and carrier and is also reliably protected against undesired excessive tilting by the spacer particles, which preferably have a homogeneous size.

As an alternative to silver glue, it is also possible to use a glue with other metallic particles (in particular shredded particles), such as a copper glue or a zinc glue.

A further alternative is a connection structure material provided as a solder material (for instance a solder paste) with spacer particles configured for withstanding typical solder temperatures. For example, zirconium oxide spacer particles are appropriate for such an embodiment.

Alternative carriers which may be used for other embodiments can be any interposer like a substrate, a ceramic substrate, a laminar substrate, a an IMS (Insulated Metal Substrate), etc.

In embodiments, the package may be configured as a half bridge, a cascode circuit, a circuit constituted by a field effect transistor and a bipolar transistor being connected in parallel to one another, or a power semiconductor circuit. Therefore, the packaging architecture according to exemplary embodiments is compatible with the requirements of very different circuit concepts.

In an embodiment, the package is configured as one the group consisting of a leadframe connected power module, a Transistor Outline (TO) electronic component, a Quad Flat No Leads Package (QFN) electronic component, a Small Outline (SO) electronic component, a Small Outline Transistor (SOT) electronic component, and a Thin More Outline Package (TSOP) electronic component. Therefore, the package according to an exemplary embodiment is fully compatible with standard packaging concepts (in particular fully compatible with standard TO packaging concepts) and appears externally as a conventional electronic component, which is highly user-convenient. In an embodiment, the package is configured as power module, e.g. molded power module. For instance, an exemplary embodiment of the electronic component may be an intelligent power module (IPM).

In a preferred embodiment, the electronic chip is configured as a controller chip, a processor chip, a memory chip, a sensor chip or a micro-electromechanical system (MEMS). In an alternative embodiment, it is also possible that the electronic chip is configured as a power semiconductor chip. Thus, the electronic chip (such as a semiconductor chip) may be used for power applications for instance in the automotive field and may for instance have at least one integrated insulated-gate bipolar transistor (IGBT) and/or at least one transistor of another type (such as a MOSFET, a JFET, etc.) and/or at least one integrated diode. Such integrated circuit elements may be made for instance in silicon technology or based on wide-bandgap semiconductors (such as silicon carbide, gallium nitride or gallium nitride on silicon). A semiconductor power chip may comprise one or more field effect transistors, diodes, inverter circuits, half-bridges, full-bridges, drivers, logic circuits, further devices, etc.

As substrate or wafer forming the basis of the electronic chips, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology. A semiconductor device according to an exemplary embodiment may be configured as micro-electromechanical system (MEMS), sensor, etc.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages of the present invention will become apparent from the following description and the appended claims, taken in conjunction with the accompanying drawings, in which like parts or elements are denoted by like reference numbers.

The illustration in the drawing is schematic.

Before describing further exemplary embodiments in further detail, some basic considerations of the present inventors will be summarized based on which exemplary embodiments have been developed.

According to an exemplary embodiment of the invention, a method for manufacturing a package (for instance an SiP package) with improved robustness is provided which is based on the combination of a surface mounted device (SMD) glue with large spacer particles therein. The spacer particles maintain a minimum distance between a component and a carrier connected by an electrically conductive connection structure comprising the glue and the spacer particles, and has therefore turned out to be capable of reliably preventing undesired delamination between the component and the carrier. Thereby, the mechanical and electrical reliability of the package can be significantly improved. Thus, an advantageous SMD glue process is provided for increased package robustness by reduced tendency of delamination at the glue interface. This is for instance highly advantageous for SiP packages or magnetic sensor packages.

Conventionally, weakness of an SMD part interconnection process occurs, with high risk of delamination even in critical areas for reliability. A result of this is a process instability, due to a glue bond line thickness being tough to be controlled. As a result, such packages with SMD parts inside an encapsulant such as a mold housing has major challenges to pass strict delamination criteria.

According to an exemplary embodiment, such conventional shortcomings may be overcome by using an SMD glue with large spacer particles (for instance having a diameter in a range between 20 μm and 200 μm). Such a connection structure allows to obtain a mechanically robust SiP package or sensor package for stress relief and therefore significant reduced delamination. Moreover, a corresponding manufacturing method may be more efficient as a result of a simplified process flow with spacer glue, due to bond line thickness being ensured by the spacer particles and due to the lack of any need to be controlled.

Moreover, exemplary embodiments allow to obtain an improved reliability behavior. The spacer glue supports an increased bond line thickness as well as a stable bond line thickness for stress decoupling and therefore a reduced risk for delamination. This enables development of package variants with SMD parts inside the integrated circuit package housing passing the delamination criteria.

Also delamination issues are removed from critical areas such as between terminals of the component, which may be sensitive for metal migration topics, etc.

One advantageous application of such an architecture are one or more SMD ceramic capacitors inside a magnetic sensor package. However, very different types of packages may be addressed by the described manufacturing process. Other exemplary embodiments may hence for example relate to SMDs inside a chip package, SiP (system in package), package in package, etc.

For example, the diameter of the spacer particles may be in a range from 20 μm or 30 μm to 200 μm. A preferred minimum bond line thickness may be a range of above 20 μm, wherein a bond line thickness of above 10 μm may be already sufficient for certain package types. There is experimental evidence that these values (generally 20 μm or in certain embodiments even 10 μm) of bond line thickness may be the start of significantly increased mechanical robustness of glue connection between SMD terminals and a leadframe or another carrier.

Appropriate spacer materials can for instance be non-conductive spacer particles (for example Si, $SiO_2$, ceramics, polymeric) in electrically conductive glues (this means typical package glues with metallic flake filler particles, for instance Ag, Au, Ni, alloys, etc.). In another embodiment, it is possible to use electrically conductive (for example metallic) spacer particles such as particles made of Ag, Au, Ni, alloys, etc. This provides an opportunity to create electric conductivity by spacer particles within electrically non-conductive glue. In yet another exemplary embodiment, it is possible to use metal plated organic spacer particles such as plastic core solder balls (for instance Cu-plated or Sn-plated). This may allow to obtain an improved drop test in terms of Thermal Cycling on Board (TCoB) reliability.

Thus, an exemplary embodiment allows to provide an improved SMD glue process within a SiP package or magnet sensor package with significantly increased mechanical robustness of bonding against delamination and improved reliability. This may enable the formation of SiP packages with more robust characteristics and simplified process flow. Such a spacer glue concept is capable of manufacturing powerful packages, for instance magnetic sensor packages meeting strict delamination criteria. Packages may be manufactured in a particular simple way with increased mechanical robustness and increased reliability.

FIG. 1 shows a cross-sectional view of a package 100 according to an exemplary embodiment. In the package 100, a passive component 106 is electrically coupled with a completely electrically conductive carrier 102 (for instance a patterned metal plate such as a leadframe made of copper). This coupling is established by an electrically conductive connection structure 108 embodied as partially electrically conductive glue filled with non-compressible solid spherical spacer particles 170.

The electrically conductive plate-type carrier 102 is here configured as a leadframe made of copper and comprises a first carrier section 142 and a second carrier section 144 separated by a recess 146 or through hole in the carrier 102. More specifically, the metal plate serving as a basis for providing the carrier 102 may be patterned (for instance punched) so that through holes are created as the recesses 146 spacing remaining carrier sections of the carrier 102. The component 106, which is here a surface mounted device (SMD) embodied as ceramic capacitor or another passive electronic member, has a first surface portion (corresponding to a first terminal 151) which is electrically connected with the first carrier section 142 by a first portion 150 of the connection structure 108. Moreover, the component 116 has a second surface portion (corresponding to a second terminal 153) electrically connected with the second carrier section 144 by a second portion 156 of the connection structure 108. As a result, the component 106 is surface mounted on the carrier 102 by two separate spaced portions 150, 156 of the connection structure 108. Together, the spaced portions 150, 156 and the component 106 bridge the recess 146 between carrier sections 142, 144.

The at least partially electrically conductive connection structure 108 comprises spherical spacer particles 170 which are configured for spacing the carrier 102 with regard to the component 106 by a distance d (which may also be denoted as bond line distance) of for instance about 20 μm. This can be accomplished by configuring the spacer particles 170 to have a diameter D of for example at least 30 μm. The diameter D of the spherical spacer particles 170 has a significant impact on the minimum distance d, although d and D need not necessarily (but may) be fully identical (for instance due to slight tilting phenomena). Although other dimensions D of the spacer particles 170 are possible, D should preferably not fall significantly below 10 μm in order to efficiently suppress highly undesired delamination between component 106 and carrier 102 in the region of their thinnest connection portion. On the other hand, the spacer particles 170 should not have a diameter D of significantly above 200 μm, because this might have an undesired impact on the homogeneity of the connection structure 108, may cause formation of voids, etc. In addition to the spacer particles 170, the connection structure 108 may comprise an at least partially electrically conductive glue. The latter is here embodied as an electrically insulating glue 130 (for instance an epoxy-based glue) with flakes of electrically conductive (for instance silver) particles 132 therein (see detail 177). The glue 130 may be hardened by curing. The electrically conductive particles 132 have irregular shape and much smaller diameters than the spacer particles 170.

Beyond this, the package 100 comprises an electronic chip 112 (such as an ASIC, application specific integrated circuit) which is also mounted on the carrier 102 by a further electrically conductive connection structure 155. The latter may for instance be a solder connection, or a connection by an electrically conductive glue. Alternatively, the further electrically conductive connection structure 155 may be embodied as the electrically conductive connection structure 108, i.e. with spacer particles 170. As can be taken from FIG. 1, the component 106 and the electronic chip 112 are mounted laterally spaced at different sections 114, 116 of the carrier 102. In one application, the electronic chip 112 may be a magnetic sensor chip capable of sensing a magnetic field in a surrounding based on the Hall effect. When a magnetic element (not shown) to be sensed by the electronic chip 112 is brought in sufficient spatial vicinity of the electronic chip 112, a corresponding electric signal can be generated by the electronic chip 112. By the signal, the presence of the magnetic elements can be detected electrically. In order to improve the quality of the sensed signal, the electric signal can be transported via the carrier 102 to the component 106 embodied as ceramic capacitor. The component 106 may smooth and thereby improve the electric signal.

The package 100 furthermore comprises an encapsulant 110, which may for instance be a mold compound. The encapsulant 110 may encapsulate the passive component 106, the connection structure 108, the electronic chip 112, and at least part of the carrier 102.

Different embodiments of the spacer particles 170 are possible, as indicated schematically in a detail 190 in FIG. 1. For instance, the spacer particles 170 may be fully electrically conductive spacer particles 170, for example metallic spheres (compare reference numeral 192). In such an embodiment, the spacer particles 170 may contribute to the electrical conductivity of the connection structure 108, so that even an electrically insulating glue 130 may be used and the electrically conductive filler particles 132 may even be omitted. It is thus possible that the spacer particles 170 consist of an electrically conductive material such as a metal. In another exemplary embodiment, fully electrically insulating spacer particles 170 may be used, see reference numeral 194. Such an embodiment may be advantageous (because it may increase the freedom of design for selecting the material of the spacer particles 170) when the spacer particles 170 shall also fulfil a further function, for instance shall have a high thermal conductivity for removing heat. In the latter mentioned embodiment, the glue 130 shall be electrically conductive (i.e. the glue 130 itself and/or electrically conductive particles 132 therein) to provide electric conductivity of the connection structure 108 as a whole. Thus, the spacer particles 170 may consist of an electrically insulating material such as zirconium oxide. In yet another exemplary embodiment, spacer particles 170 may be implemented which have an electrically insulating core 172 (with a freely adjustable function, for instance thermal conductivity) and an electrically conductive coating 174 covering or coating the core 172. In the latter mentioned embodiment, the spacer particles 170 may also contribute to the electric conductivity of the connection structure 108. Hence, dielectric core 172, for instance made of zirconium oxide, may be covered by electrically conductive coating 174 such as a metallic layer. The metallic layer may be formed by plating. The latter mentioned embodiment may also use high temperature stable dielectric material forming part of the spacer particles 170. The latter additionally contribute to the electric connection between component 106 and carrier 102 due to the coating 174.

Still referring to FIG. 1, the component 106 is mounted with a defined minimum standoff of at least 20 µm on the carrier 102 with the connection structure 108 in between. The entire gap between component 106 and carrier 102 is continuously filled with the electrically conductive connection structure 108. As can be taken from FIG. 1, some of the spacer particles 170 are sandwiched between carrier 102 and component 106 and therefore maintain a minimum distance a in between while at the same time ensuring a substantially tilting-free mounting of the component 106 on the carrier 102.

On the same carrier 102, the electronic chip 112 is mounted. During operation, the electronic chip 112 embodied as magnetic Hall sensor measures a magnetic element in a surrounding and generates the corresponding electric signal indicative of the presence of the magnetic element. This electric signal is smoothened by the capacitor type component 106.

The reliability of the package 100 shown in FIG. 1 is very high, even when a green mold type compound is used as encapsulant 110 encapsulating the component 106 and the electronic chip 112.

Although not shown in the figures, a package 100 according to another exemplary embodiment can be configured in accordance with FIG. 1 with the difference that the connection structure 108 can be embodied as solder paste with spacer particles 170 therein rather than (as in FIG. 1) with an at least partially electrically conductive curable glue 130. When solder is used for providing electric conductivity of the connection structure 108, the spacer particles 170 may be advantageously made of a material withstanding solder temperatures so as to remain in their shape upon soldering. For instance, the spacer particles 170 may then be made of zirconium oxide.

Figure 2:
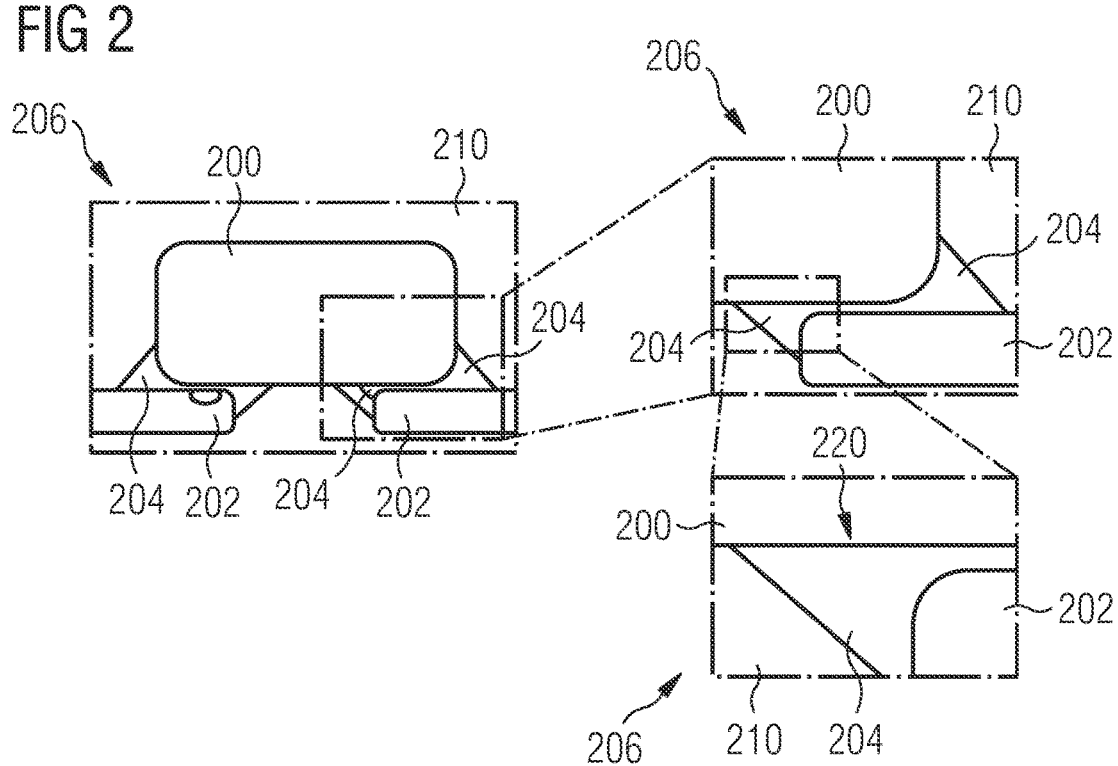
FIG. 2 shows cross-sectional views of a conventional package suffering from delamination.

FIG. 2 shows cross-sectional views of a conventional package 206 suffering from delamination.

More specifically, FIG. 2 illustrates a component 200 mounted on a carrier 202 with a connection structure 204 in between. The described package 206 is encapsulated by a green mold compound type encapsulant 210. As can be taken from FIG. 2, substantial delamination (compare reference numeral 220) between component 200 and carrier 202 occurs even in the absence of thermal cycling load or heating of the package 210 to a high temperature for simulating harsh conditions during practical use of package 206. Therefore, the package 206 shown in FIG. 2 is not suitable for instance for demanding automotive applications.

Figure 3:
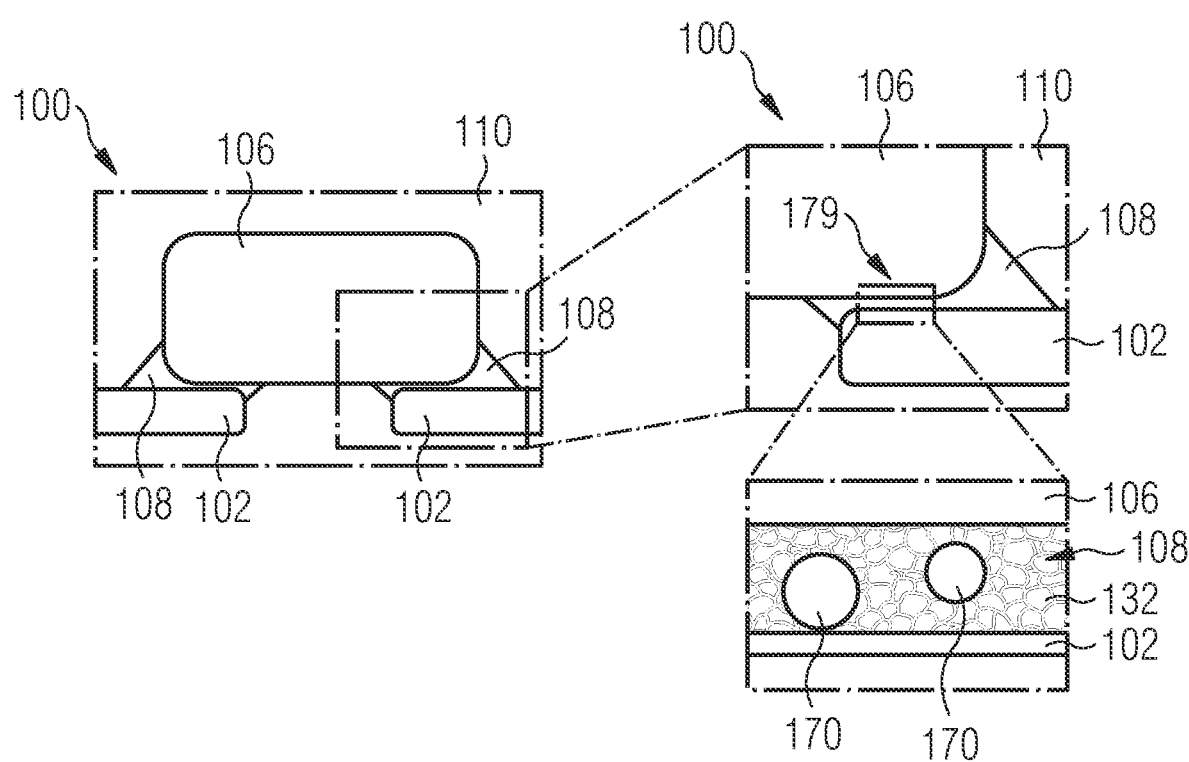
FIG. 3 shows cross-sectional views of a delamination robust package according to an exemplary embodiment.

FIG. 3 shows cross-sectional views of a delamination robust package 100 according to an exemplary embodiment.

In comparison to FIG. 2, FIG. 3 shows corresponding measurements carried out with a package 100 according to an exemplary embodiment. Cross-sections of spherical spacer bodies 170 are shown in FIG. 3. They have a size of for instance 30 µm thickness and therefore maintain a substantial spacing between component 106 and spacer 102 of for instance at least 20 µm. It should be mentioned that the cross-sections of the spacer particles 170 shown in FIG. 3 do not necessarily show the spacer particles 170 with their maximum thickness, because the orientation and position of the spacer particles 170 is arbitrary so that the shown cross-sectional view does not necessarily cut them at their full diameter. As can be taken from FIG. 3 (see reference numeral 179), no delamination occurs when the spacer particles 170 have been added to the electrically insulating glue 130 with shredded silver particles 132 therein. This does not only apply to the stress-free state of package 100 at which the conventional package 206 of FIG. 2 has already failed, but this protection against delamination is maintained when applying high temperature stress or temperature cycles to the package 100.

FIG. 4 shows results of a simulation concerning mechanical load acting on a conventional package 206, as the one shown in FIG. 2, suffering from delamination.

On the left-hand side of FIG. 4 (see A), a three-dimensional view of the modelled package 210 can be seen. The image of FIG. 4 in the center (see B) relates to the glue top side, whereas the image on the right-hand side of FIG. 4 (see C) relates to the glue bottom side. It can be seen that maximum stress is applied at the glue top side.

FIG. 5 shows results of a simulation concerning mechanical load acting on a delamination robust package 100 according to an exemplary embodiment.

In contrast to FIG. 4, the simulations carried out for package 100 according to an exemplary embodiment show correspondingly that the stress and therefore the delamination tendency can be significantly reduced in exemplary embodiments. The three images (see A, B, C) of FIG. 5 correspond to the respective three images (see A, B, C) of FIG. 4. As can be seen in the central image (see B) of FIG. 5, the glue top side remains below its limit of breakage.

FIG. 6 shows cross-sectional views of a delamination robust package 100 according to an exemplary embodiment after having applied stress. This stress has been a temperature of 170° C. for 500 hours. As can be taken from FIG. 6, the spacer particles 170 have prevented delamination so that the stress test is passed. A glue thickness of 30 µm is maintained. Thus, a significantly reduced tendency of delamination can be obtained. Moreover, a lower risk of silver migration is involved since no delamination in critical area occurs.

It should be noted that the term "comprising" does not exclude other elements or features and the "a" or "a" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, and composition of matter, means, methods and steps described in the specification. Accordingly, the appended claims are intended to include within their scope such processes, machines, manufacture, compositions of matter, means, methods, or steps.

What is claimed is:

1. A package, comprising:
an at least partially electrically conductive carrier;
a passive component mounted on the at least partially electrically conductive carrier;
an at least partially electrically conductive connection structure electrically connecting the at least partially electrically conductive carrier with the passive component and comprising spacer particles configured for spacing the at least partially electrically conductive carrier with regard to the passive component;
wherein the at least partially electrically conductive connection structure comprises an at least partially electrically conductive material in which the spacer particles are embedded, wherein the at least partially electrically conductive material is a solder with the spacer particles therein; and
wherein the at least partially electrically conductive carrier comprises a planar first carrier section and a planar second carrier section separated by a recess, wherein the passive component has a first surface portion parallel to and electrically connected with the first carrier section by a first portion of the at least partially electrically conductive connection structure at least partially between a gap between the first surface portion and the first carrier section and has a second surface portion parallel to and electrically connected with the planar second carrier section by a separate second portion of the at least partially electrically conductive connection structure at least partially between a gap between the second surface portion and the planar second carrier section.

2. The package according to claim 1, comprising where the spacer particles are made of an electrically conductive material.

3. The package according to claim 2, wherein the spacer particles are made of a polymeric material having an electrically conductive coating.

4. The package according to claim 1, wherein the spacer particles comprise at least one of the group consisting of fully electrically conductive spacer particles, fully electrically insulating spacer particles, and spacer particles having an electrically insulating core and an electrically conductive coating at least partially covering the electrically insulating core.

5. The package according to claim 1, where the spacer particles are made of a polymeric material with a metallic coating.

6. The package according to claim 5, wherein the metallic coating is copper.

7. The package according to claim 1, wherein the spacer particles comprise a dielectric core covered with an electrically conductive coating.

8. The package according to claim 1, comprising where the spacer particles are spherical shaped.

9. The package according to claim 1, comprising an electronic chip mounted on the at least partially electrically conductive carrier.

10. A package, comprising:
an at least partially electrically conductive carrier;
a passive component mounted on the at least partially electrically conductive carrier;
an at least partially electrically conductive connection structure electrically connecting the at least partially electrically conductive carrier with the passive component and comprising spacer particles configured for spacing the at least partially electrically conductive carrier with regard to the passive component;
wherein the at least partially electrically conductive connection structure comprises an at least partially electrically conductive material in which the spacer particles are embedded, wherein the at least partially electrically conductive material is a solder with electrically conductive particles therein; and
wherein the at least partially electrically conductive carrier comprises a planar main surface that includes a planar first carrier section aligned with a planar second carrier section that are separated by a recess, wherein the passive component has a planar main surface that includes a first surface portion and a second surface portion, wherein the first surface portion is electrically connected with the planar first carrier section by a first portion of the at least partially electrically conductive connection structure at least partially between a gap between the first surface portion and the planar first carrier section and the second surface portion is electrically connected with the planar second carrier section by a separate second portion of the at least partially electrically conductive connection structure at least partially between a gap between the second surface portion and the planar second carrier section such that the planar main surface of the at least partially electrically conductive carrier is opposing and at least substantially parallel with the planar main surface of the passive component.

11. The package according to claim 10, comprising at least one of the following features:
wherein the spacer particles have a diameter (D) of at least 10 pm, in particular of at least 30 um; and
wherein the spacer particles have a diameter (D) of not more than 200 um.

12. The package according to claim 10, wherein the spacer particles have a substantially spherical shape.

13. The package according to claim 10, wherein the spacer particles comprise at least one of the group consisting of fully electrically conductive spacer particles, fully electrically insulating spacer particles, and spacer particles having an electrically insulating core and an electrically conductive coating at least partially covering the core.

14. The package according to claim 10, wherein the spacer particles are made of an electrically conductive material.

15. The package according to claim 10, comprising an electronic chip mounted on the at least partially electrically conductive carrier.

16. The package according to claim 10, comprising where the at least partially electrically conductive material is solder, and includes the spacer particles made of a polymeric material having a metallic coating.

17. A package, comprising:
an at least partially electrically conductive carrier comprising a planar first carrier section and a planer second carrier section separated by a recess, the planar first carrier section aligned with the planar second carrier section;
a passive component comprising a first terminal comprising a planar first surface portion parallel to and opposing the planar first carrier section and a second terminal comprising a planar second surface portion parallel to and opposing the planar second carrier section, the planar first surface portion aligned with the planar second surface portion; and
an at least partially electrically conductive connection structure electrically connecting the planar first carrier section to the planar first surface portion and the planar second carrier section to the planar second surface portion, the at least partially electrically conductive connection structure comprising an electrically conductive material in which spacer particles are embedded, and the spacer particles configured for spacing the planar first carrier section to the planar first surface portion and the planar second carrier section to the planar second surface portion.

18. The package according to claim 17, comprising an electronic chip mounted to the planar first carrier section.

19. The package according to claim 18, comprising where the at least partially electrically conductive material is solder, and includes the spacer particles made of a polymeric material having a metallic coating.

20. The package according to claim 19, wherein the metallic coating is copper.

* * * * *